US011222876B2

(12) United States Patent
Ohmae et al.

(10) Patent No.: US 11,222,876 B2
(45) Date of Patent: Jan. 11, 2022

(54) DISPLAY DEVICE AND ELECTRONIC APPARATUS (71) Applicants: SONY CORPORATION, Tokyo (JP); SONY SEMICONDUCTOR SOLUTIONS CORPORATION, Kanagawa (JP)

(72) Inventors: Akira Ohmae, Kanagawa (JP); Yusuke Kataoka, Kanagawa (JP); Tatsuo Ohashi, Kanagawa (JP); Norifumi Kikuchi, Kanagawa (JP); Katsuhiro Tomoda, Kanagawa (JP); Goshi Biwa, Kanagawa (JP); Ippei Nishinaka, Kagoshima (JP)

(73) Assignees: SONY CORPORATION, Tokyo (JP); SONY SEMICONDUCTOR SOLUTIONS CORPORATION, Kanagawa (JP)

(*) Notice: Subject to any disclaimer, the term of this patent is extended or adjusted under 35 U.S.C. 154(b) by 16 days.

(21) Appl. No.: 16/617,292

(22) PCT Filed: May 7, 2018

(86) PCT No.: PCT/JP2018/017590
§ 371 (c)(1),
(2) Date: Nov. 26, 2019

(87) PCT Pub. No.: WO2018/225432
PCT Pub. Date: Dec. 13, 2018

(65) Prior Publication Data
US 2021/0134765 A1 May 6, 2021

(30) Foreign Application Priority Data
Jun. 5, 2017 (JP) .............................. JP2017-110597

(51) Int. Cl.
*H01L 25/075* (2006.01)

(52) U.S. Cl.
CPC ................................ *H01L 25/0753* (2013.01)

(58) Field of Classification Search
CPC ....... H01L 25/0753; H01L 27/32–3293; H01L 27/156; H01L 27/1214–1296;
(Continued)

(56) References Cited

U.S. PATENT DOCUMENTS

2009/0109172 A1* 4/2009 Lee ........................ G09G 3/344
345/107
2016/0121073 A1* 5/2016 Mok ..................... A61N 5/0618
600/27

(Continued)

FOREIGN PATENT DOCUMENTS

CN          1725917 A       1/2006
CN         104282718 A      1/2015
(Continued)

OTHER PUBLICATIONS

International Search Report and Written Opinion of PCT Application No. PCT/JP2018/017590, dated Jul. 24, 2018, 12 pages of ISRWO.

(Continued)

Primary Examiner — Cuong B Nguyen
(74) Attorney, Agent, or Firm — Chip Law Group (57) ABSTRACT There is provided a display device including a plurality of unit regions disposed adjacent to each other, a first region that is provided in each of the unit regions, and emits first light, and a second region that is provided outside the first region in each of the unit regions, and emits second light. The second light is different from the first light in at least one of luminance, wavelength, or surface-reflection component, the second regions are provided between adjacent ones of the first regions, and a difference in luminance, wavelength, or surface-reflection component between the second light to
(Continued)

be emitted from adjacent ones of the unit regions is smaller than a difference in luminance, wavelength, or surface-reflection component between the first light and the second light in a same one of the unit regions.

16 Claims, 11 Drawing Sheets

(58) Field of Classification Search
CPC . H01L 27/3244–3279; H01L 2021/775; H01L 31/125; H01L 51/50–56; H01L 2227/32–326; H01L 27/3239
See application file for complete search history.

(56) References Cited

U.S. PATENT DOCUMENTS

| | | |
|---|---|---|
| 2016/0148981 A1 | 5/2016 | Matsueda |
| 2017/0025482 A1* | 1/2017 | Choi .................... H01L 27/322 |
| 2017/0077436 A1 | 3/2017 | Yue et al. |
| 2018/0040665 A1 | 2/2018 | Ohmae et al. |
| 2021/0090487 A1* | 3/2021 | Chu .................... H01L 25/0753 |

FOREIGN PATENT DOCUMENTS

| | | |
|---|---|---|
| CN | 105448950 A | 3/2016 |
| CN | 106104660 A | 11/2016 |
| CN | 107408364 A | 11/2017 |
| JP | 2003-022037 A | 1/2003 |
| JP | 2006-041283 A | 2/2006 |
| JP | 2009-169196 A | 7/2009 |
| JP | 2014-096505 A | 5/2014 |
| JP | 2015-092529 A | 5/2015 |
| JP | 2015-184542 A | 10/2015 |
| WO | 2015/146274 A1 | 10/2015 |
| WO | 2016/152321 A1 | 9/2016 |

OTHER PUBLICATIONS

Office Action for CN Patent Application No. 201880035290X, dated May 8, 2021, 08 pages of English Translation and 10 pages of Office Action.

* cited by examiner

DISPLAY DEVICE AND ELECTRONIC APPARATUS

CROSS REFERENCE TO RELATED APPLICATIONS

This application is a U.S. National Phase of International Patent Application No. PCT/JP2018/017590 filed on May 7, 2018, which claims priority benefit of Japanese Patent Application No. JP 2017-110597 filed in the Japan Patent Office on Jun. 5, 2017. Each of the above-referenced applications is hereby incorporated herein by reference in its entirety.

TECHNICAL FIELD

The present technology relates to a display device that is applicable to, for example, a tiling display or the like, and to an electronic apparatus.

BACKGROUND ART

Self-emitting display panels using a light-emitting element such as a light-emitting diode (LED: Light-Emitting Diode) has been developed (for example, see PTL 1). It is proposed to configure a tiling display (a display device) by linking a plurality of such self-emitting display panels together.

CITATION LIST

Patent Literature

PTL 1: Japanese Unexamined Patent Application Publication No. 2015-92529

SUMMARY OF THE INVENTION

In such a display device, enhancement of image quality is desired.

It is therefore desirable to provide a display device and an electronic apparatus that allow for enhancement of image quality.

A display device according to an embodiment of the present technology includes: a plurality of unit regions disposed adjacent to each other; a first region that is provided in each of the unit regions, and emits first light; and a second region that is provided outside the first region in each of the unit regions, and emits second light, the second light being different from the first light in at least one of luminance, wavelength, or surface-reflection component. The second regions are provided between adjacent ones of the first regions, and a difference in luminance, wavelength, or surface-reflection component between the second light to be emitted from adjacent ones of the unit regions is smaller than a difference in luminance, wavelength, or surface-reflection component between the first light and the second light in a same one of the unit regions.

An electronic apparatus according to an embodiment of the present technology includes the display device according to the embodiment of the present technology.

In the display device or the electronic apparatus according to the embodiment of the present technology, in the vicinity of a portion where the unit regions are in contact with each other, the second light having mutually close optical characteristics is emitted from the respective second regions in the unit regions; therefore, an optical border between the unit regions is less likely to be recognized.

According to the display device and the electronic apparatus of the embodiments of the present technology, in the vicinity of a portion where the unit regions are in contact with each other, the second light having mutually close optical characteristics is emitted from the respective second regions in the unit regions; therefore, an optical border between the unit regions is less likely to be recognized. This makes it possible to enhance the image quality. It is to be noted that effects described above are not necessarily limitative, and any of effects described in the present disclosure may be provided.

MODES FOR CARRYING OUT THE INVENTION

Hereinafter, some embodiments of the present technology will be described in detail with reference to the drawings. It is to be noted that descriptions are given in the following order.
1. First Embodiment (a display device provided with a first region and a second region for each of display panels)

2. Modification Example 1 (an example in which luminance of first light and luminance of second light are different from each other)
3. Modification Example 2 (an example in which a surface-reflection component of first light and a surface-reflection component of second light are different from each other)
4. Second Embodiment (a display device provided with a first region and a second region for each of units)
5. Application Example (an electronic apparatus)

1. First Embodiment

Figure 1:
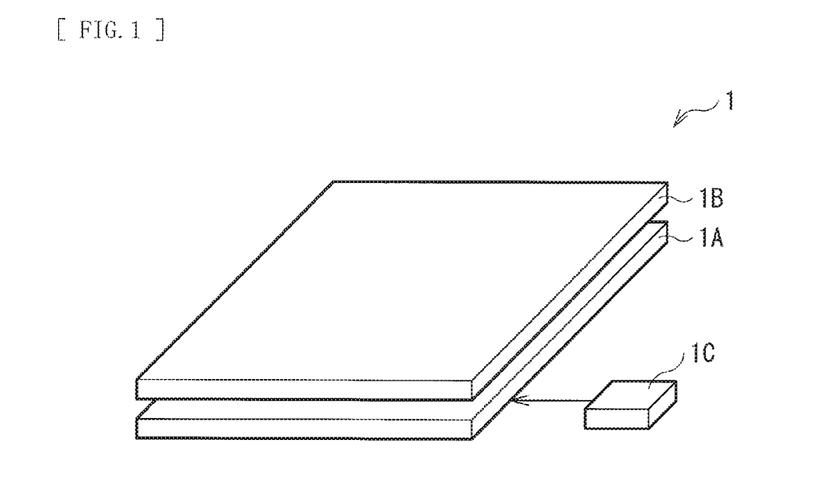
FIG. 1 is an exploded perspective view of a schematic configuration of a display device according to a first embodiment of the present technology.

FIG. 1 schematically illustrates an overall configuration of a display device (a display device 1) according to a first embodiment of the present technology. The display device 1 includes, for example, an element substrate 1A, a counter substrate 1B opposed to the element substrate 1A, and a control circuit 1C that drives the element substrate 1A. For example, a front surface of the counter substrate 1B (a surface on a side opposite to a surface opposed to the element substrate 1A) is an image display surface, a middle portion of the image display surface is a display region, and a peripheral portion of the image display surface is a non-display region. The counter substrate 1B allows light with a wavelength of a visible region to pass therethrough. The counter substrate 1B includes a light transmissive material such as a glass substrate, a transparent resin substrate, and a transparent resin film, for example.

Figure 2:
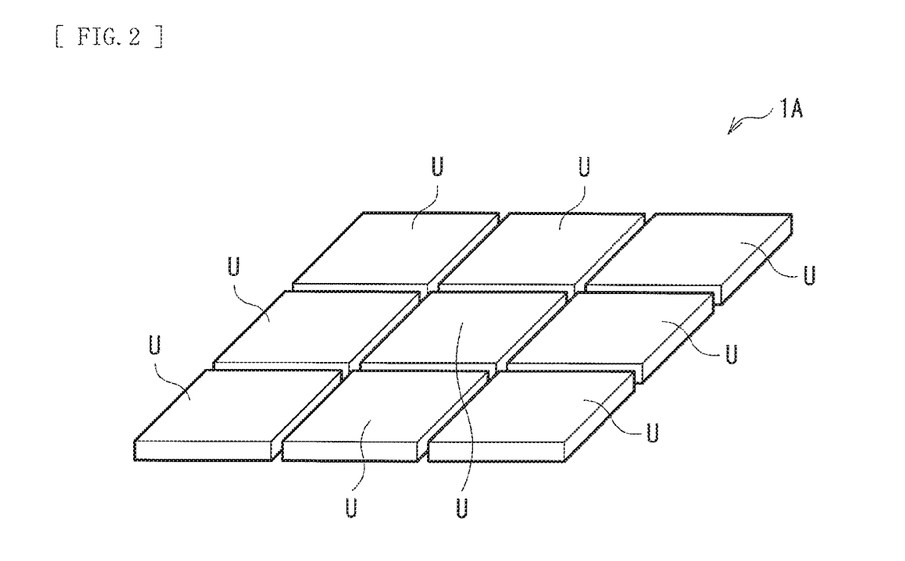
FIG. 2 is a perspective view of a schematic configuration of an element substrate illustrated in FIG. 1.

FIG. 2 schematically illustrates an example of a configuration of the element substrate 1A illustrated in FIG. 1. The display device 1 is a so-called tiling display, and the element substrate 1A includes a plurality of units (units U) that are laid in a tiled pattern. FIG. 2 illustrates an example in which the element substrate 1A includes the nine units U; however, the number of units U may be ten or more, or may be eight or less.

Figure 3:
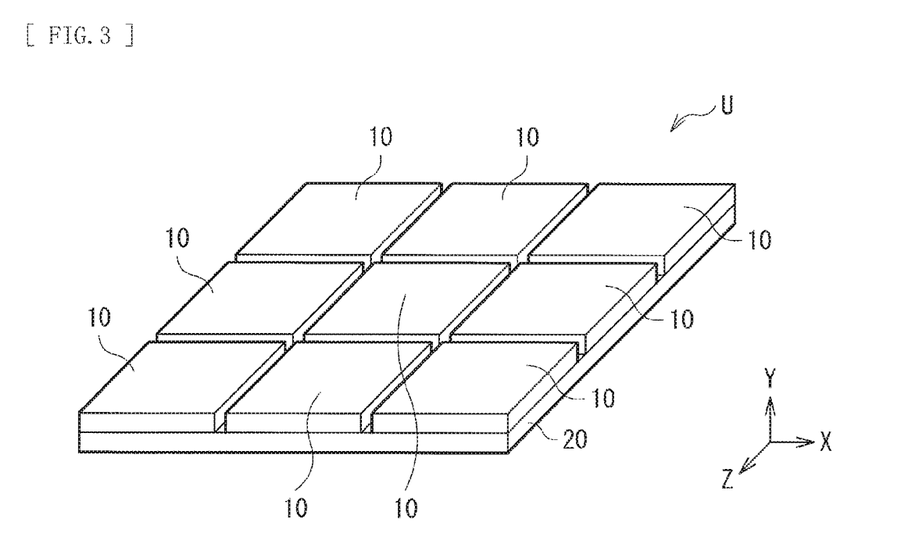
FIG. 3 is a perspective view of a schematic configuration of a unit illustrated in FIG. 2.

FIG. 3 schematically illustrates an example of a configuration of the unit U. The unit U has, for example, a plurality of display panels (display panels 10) that are laid in a tiled pattern, and a support substrate (a support substrate 20) for these display panels 10. A surface on a side opposite to a display surface of each of the display panels 10 is opposed to the support substrate 20. The support substrate 20 includes, for example, a metallic plate.

Figure 4:
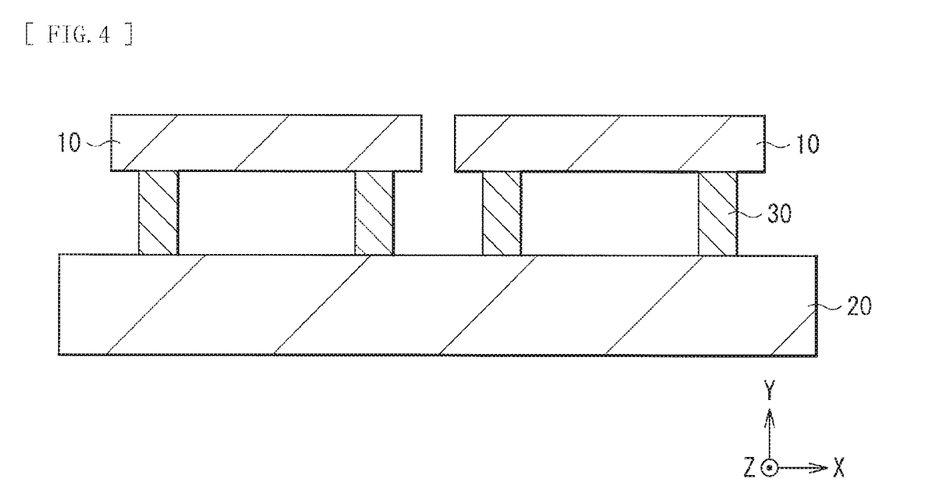
FIG. 4 is a schematic cross-sectional view of a schematic configuration of a unit illustrated in FIG. 3.

FIG. 4 schematically illustrates an example of a configuration between the display panels 10 and the support substrate 20. The display panels 10 are fixed to the support substrate 20 with use of, for example, fixing members (fixing members 30).

Figure 5:
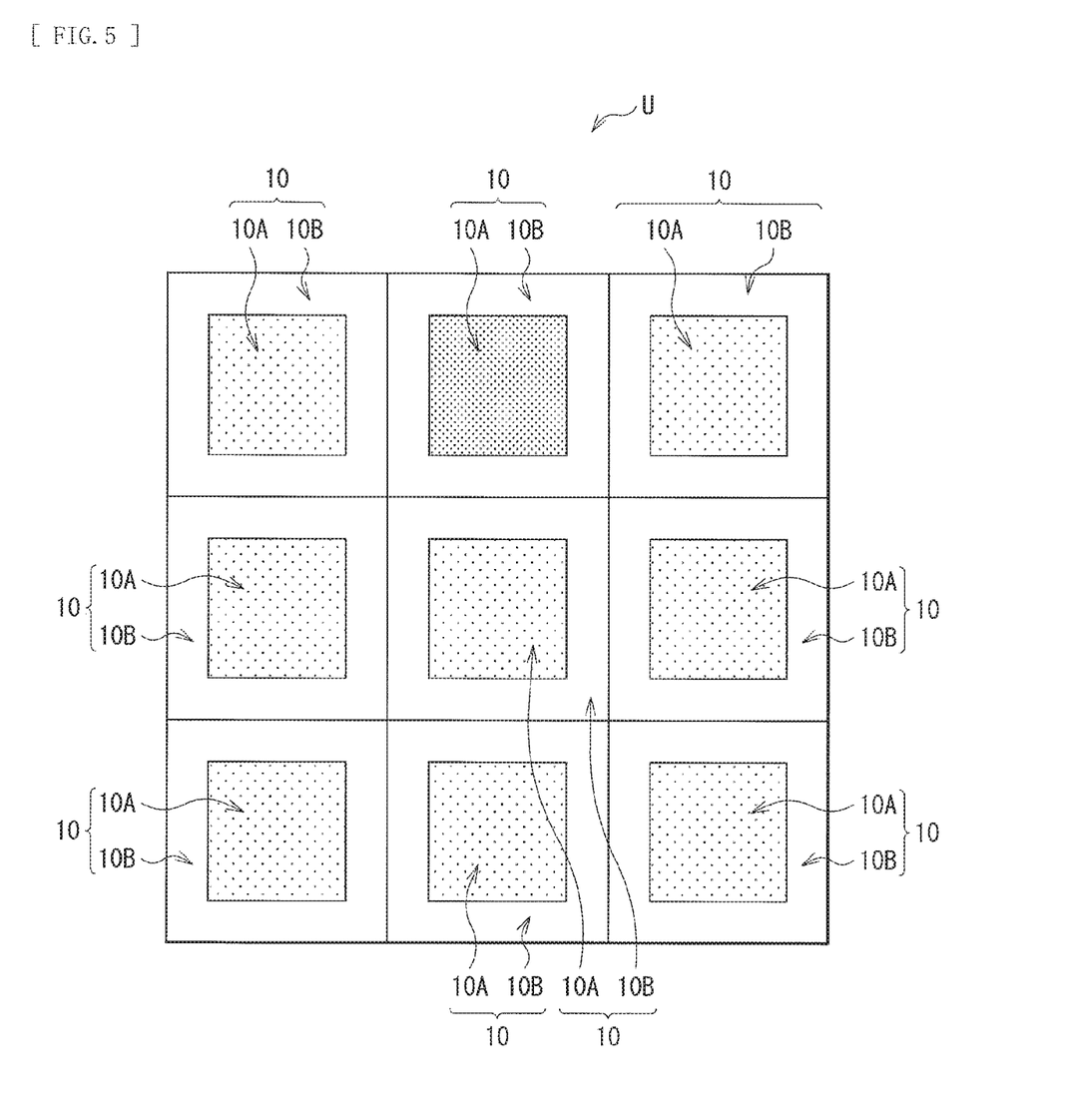
FIG. 5 is a schematic plan view of a schematic configuration of each of a plurality of display panels illustrated in FIG. 3.

FIG. 5 illustrates a schematic planar configuration of each of the display panels 10. Each of the display panels 10 is provided with a first region 10A in a middle portion, and a second region 10B outside the first region 10A. A planar shape of the first region 10A is, for example, a square, and a planar shape of the second region 10B is a frame-like square surrounding the first region 10A. The planar shapes of the first region 10A and the second region 10B may be any shapes other than the square. For example, areas of the first regions 10A that are provided in the respective display panels 10 are equal to each other, and areas of the second regions 10B that are provided in the respective display panels 10 are equal to each other. The display panel 10 may be present in which the area of the first region 10A or the second region 10B is different from the area of any of other first regions 10A or second regions 10B. The second regions 10B are provided between adjacent ones of the first regions 10A. Here, the second regions 10B are in contact with each other between the adjacent ones of the display panels 10. Here, the display panel 10 corresponds to a specific example of a "unit region" in the present technology.

Figure 6A:
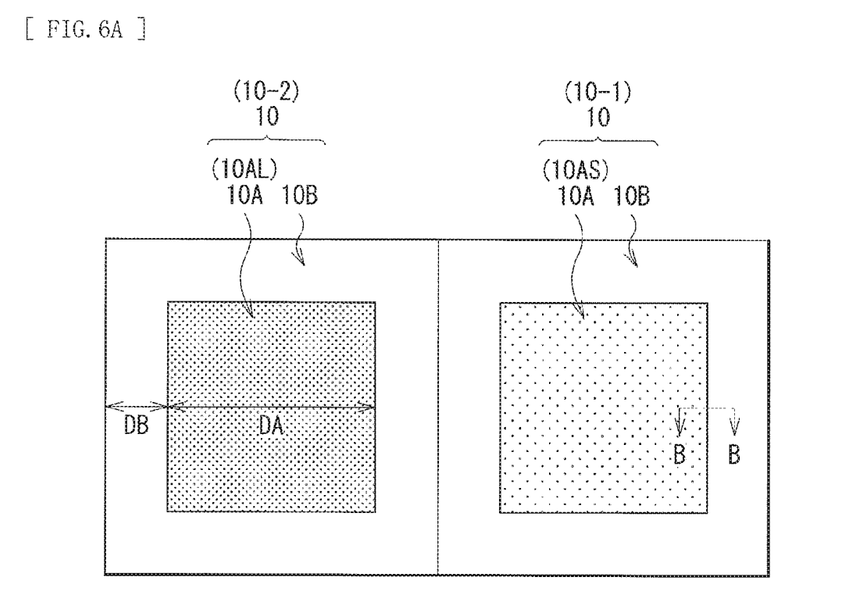
FIG. 6A is an enlarged schematic plan view of two adjacent display panels of the plurality of display panels illustrated in FIG. 5.
Figure 6B:
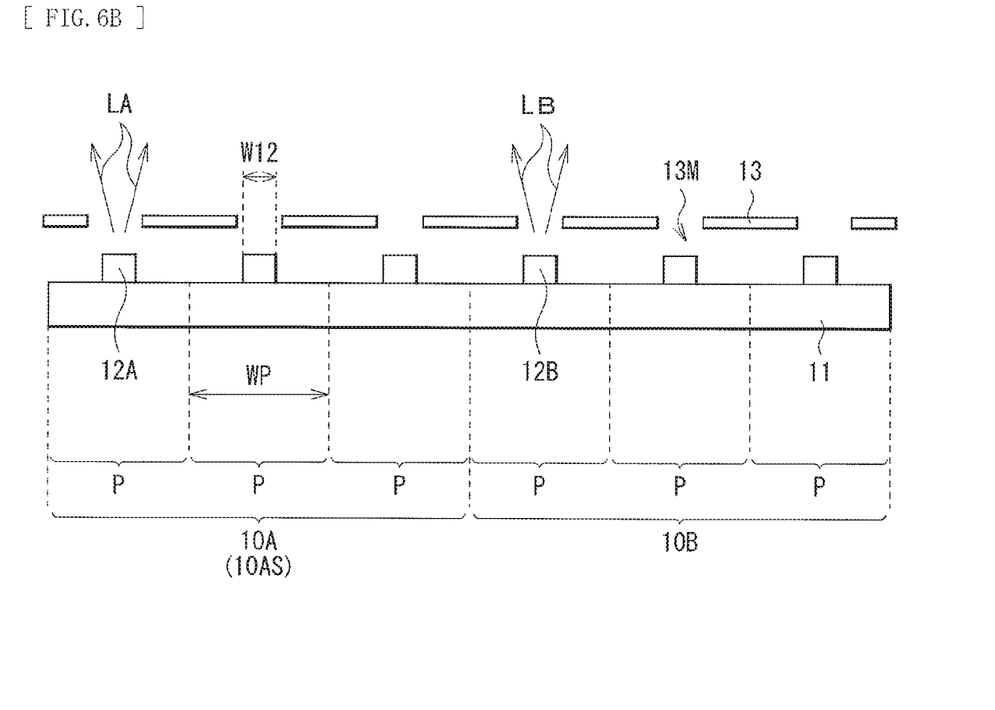
FIG. 6B is a schematic diagram of a cross-sectional configuration taken along a line B-B illustrated in FIG. 6A.

FIG. 6A illustrates, in an enlarged manner, two adjacent display panels 10 (a display panel 10-1 and a display panel 10-2) of the plurality of display panels 10 illustrated in FIG. 5. FIG. 6B illustrates a cross-sectional configuration taken along a line B-B illustrated in FIG. 6A. Each of the display panel 10-1 (a first unit region) and the display panel 10-2 (a second unit region) has, on a mounting substrate 11, a plurality of light-emitting elements (first light-emitting elements 12A and second light-emitting elements 12B) and a light-shielding layer (a black layer) 13. The first region 10A of each of the display panel 10-1 and the display panel 10-2 has the plurality of first light-emitting elements 12A on the mounting substrate 11, and the second region 10B of each of the display panel 10-1 and the display panel 10-2 has the plurality of second light-emitting elements 12B on the mounting substrate 11. The first light-emitting element 12A and the second light-emitting element 12B are disposed for each of pixels P, and each of these light-emitting elements is coupled to a drive circuit, for example. The plurality of pixels P is disposed, for example, in a matrix pattern over the first region 10A and the second region 10B.

The mounting substrate 11 includes, for example, a plate-shaped member that includes glass or the like, and a wiring layer that drives the first light-emitting element 12A and the second light-emitting element 12B. The plate-shaped member may include a resin material or a metallic material having a front surface subjected to insulating treatment.

The first light-emitting elements 12A and the second light-emitting elements 12B include, for example, light-emitting diodes (LEDs: Light-Emitting Diodes). The first light-emitting elements 12A and the second light-emitting elements 12B each preferably include, for example, a micro LED having a size W12 on a side of about several hundred μm, for example. The use of the micro LED for each of the first light-emitting elements 12A and the second light-emitting elements 12B makes it possible to achieve the high-definition display panel 10. Further, this allows for enhancement of contrast. At this time, it is preferable that, for example, a size WP on a side of the pixel P be within a range of 0.2 mm to 4 mm, and an area occupied by the first light-emitting element 12A or the second light-emitting element 12B relative to the area of the single pixel P be 10% or less.

First light LA is emitted from each of the first light-emitting elements 12A, and second light LB is emitted from each of the second light-emitting elements 12B. In the display panel 10-1, for example, an average wavelength of the first light LA to be emitted from the first region 10A (a first region 10AS) is shorter than an average wavelength of the second light LB to be emitted from the second region 10B, and a difference between the average wavelength of the first light LA and the average wavelength of the second light LB is within 2 nm. In the display panel 10-2, for example, the average wavelength of the first light LA to be emitted from the first region 10A (a first region 10AL) is longer than the average wavelength of the second light LB to be emitted from the second region 10B, and a difference between the average wavelength of the first light LA and the average wavelength of the second light LB is within 2 nm.

In the present embodiment, a difference between the average wavelengths of the second light LB to be emitted from the respective second regions 10B in the adjacent display panels 10-1 and 10-2 is smaller than a difference between the average wavelength of the first light LA and the average wavelength of the second light LB in each of the display panels 10-1 and 10-2. The average wavelengths of the second light LB to be emitted from the respective second regions 10B in the adjacent display panels 10-1 and 10-2 are, for example, substantially the same. Here, the average wavelengths of the second light LB to be emitted from the respective second regions 10B in the adjacent display panels 10-1 and 10-2 being substantially the same means that the average wavelengths are the same to such a degree that it is possible to exhibit an effect thereof even though some manufacturing errors, sorting errors, etc. are included. As will hereinafter be described in detail, this suppresses generation of a visual border between the display panel 10-1 and the display panel 10-2.

In other words, in the display panels 10-1 and 10-2, the first light-emitting element 12A and the second light-emitting element 12B are sorted depending on emission wavelengths of light-emitting elements after manufacturing to be disposed in any of the first region 10A and the second region 10B. For example, a light-emitting element (the first light-emitting element 12A) that emits light of a shorter wavelength (the first light LA) is disposed in the first region 10AS of the display panel 10-1, and a light-emitting element (the first light-emitting element 12A) that emits light of a longer wavelength (the first light LA) is disposed in the first region 10AL of the display panel 10-2. Light-emitting elements (the second light-emitting elements 12B) that emit light of a wavelength between the shorter wavelength and the longer wavelength (the second light LB) are disposed in the second regions 10B of the display panels 10-1 and 10-2.

Figure 7:
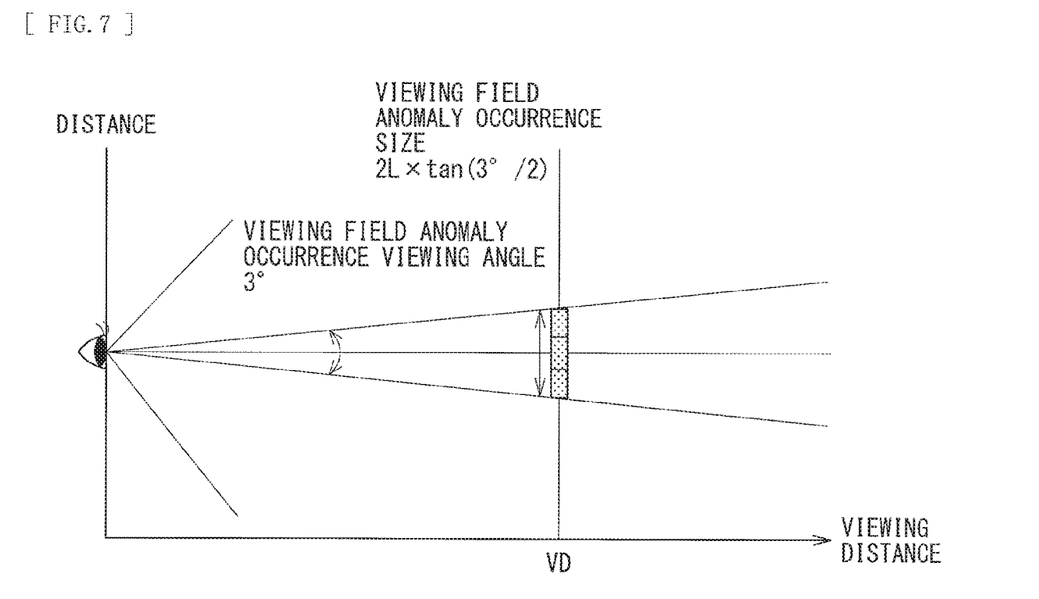
FIG. 7 is an explanatory diagram describing a viewing distance.

For example, a length DA on a side of the square-shaped first region 10A is within the range of 7 cm to 26 cm, and a width DB of the frame-shaped second region 10B is within the range of 3 cm to 5 cm. As illustrated in FIG. 7, a relationship between a viewing distance VD from a viewer to the display panel 10 and the width DB preferably satisfies the following expression (1). If the viewing distance VD and the width DB satisfy a relationship of the expression (1), it is possible to surely suppress generation of the visual border between the display panel 10-1 and display panel 10-2 adjacent to each other.

$$DB > 2VD \times \tan(3°/2)/2 \qquad (1)$$

Note that the expression (1) is applied in a case where a size (DA+2DB) on a side of the display panel 10 is smaller than a viewing angle anomaly occurrence size (2VD×tan(3°/2)/2).

The first light LA and the second light LB are, for example, light of a blue wavelength band. For example, the average wavelength of the first light LA to be emitted from the first region 10AS of the display panel 10-1 is 462 nm, and the average wavelength of the first light LA to be emitted from the first region 10AL of the display panel 10-2 is 466 nm. The average wavelength of the second light LB to be emitted from the second region 10B of each of the display panels 10-1 and 10-2 is 464 nm. The display panel 10 is provided with a light-emitting element that emits light of a red wavelength band, a light-emitting element that emits light of a green wavelength band, and a light-emitting element that emits light of the blue wavelength band, and performs chromaticity correction between the adjacent display panels 10-1 and 10-2.

Each of the first light-emitting element 12A and the second light-emitting element 12B has, for example, a first electrical conductivity-type (p-type) semiconductor layer, an active layer, and a second electrical conductivity-type (n-type) semiconductor layer, and the active layer is disposed between the first electrical conductivity-type semiconductor layer and the second electrical conductivity-type semiconductor layer. It is possible to use, for example, an InGaN-based semiconductor material for the first electrical conductivity-type semiconductor layer, the active layer, and the second electrical conductivity-type semiconductor layer.

The first light LA and the second light LB may be, for example, light of the red wavelength band or light of the green wavelength band. The first electrical conductivity-type semiconductor layer, the active layer, and the second electrical conductivity-type semiconductor layer that configure the first light-emitting element 12A and the second light-emitting element 12B may include an AlGaInP-based semiconductor material.

The first light-emitting element 12A and the second light-emitting element 12B are formed using, for example, a transfer technique in the following manner. First, respective semiconductor layers included in the first light-emitting element 12A and the second light-emitting element 12B is epitaxially grown in order on a growth substrate, and thereafter each of the semiconductor layers is shaped in a desired size. Next, the first light-emitting element 12A and the second light-emitting element 12B are formed by transferring the shaped semiconductor layers onto another substrate from the growth substrate. The transfer is performed using, for example, a physical pickup method or a laser peeling method. On the substrate on which the semiconductor layers are transferred, for example, light-emitting elements (including the first light-emitting element 12A and the second light-emitting element 12B) that emit light of each color are disposed at a predetermined pitch. Forming the first light-emitting element 12A and the second light-emitting element 12B with use of the transfer technique makes it possible to enhance wavelength uniformity of the first light LA and the second light LB that are emitted from the first light-emitting element 12A and the second light-emitting element 12B.

The light-shielding layer 13 is opposed to the mounting substrate 11 with the first light-emitting element 12A and the second light-emitting element 12B interposed therebetween. The light-shielding layer 13 has an opening 13M at a position opposed to each of the first light-emitting element 12A and the second light-emitting element 12B, and the first light LA and the second light LB are extracted through the opening 13M. The light-shielding layer 13 includes, for example, a resin material containing a black additive such as carbon. Examples of the resin material include acrylic resin, epoxy-based resin, urethane-based resin, silicone-based resin, cyanoacrylate-based resin, etc. The light-shielding layer 13 is covered with, for example, a resin layer or the like, and the first light LA and the second light LB are extracted from the opening 13M of the light-shielding layer 13 through the resin layer or the like.

In the display device 1, on the basis of an image signal that is inputted externally, the control circuit 1C supplies a drive current (outputs a drive signal) to each of the pixels P of the display panel 10. In each of the pixels P, the first light-emitting element 12A and the second light-emitting element 12B emit light with predetermined luminance on the basis of the supplied drive current. In the present embodiment, each of the display panels 10 is provided with the first region 10A and the second region 10B, and the second region 10B is provided between the adjacent first regions 10A (the first regions 10AS and 10AL in FIG. 6A). Here, the adjacent display panels 10 (the display panels 10-1 and 10-2 in FIG. 6A) are in contact with each other with the respective second regions 10B interposed therebetween. The average wavelengths of the second light LB to be emitted from the respective second regions 10B in the adjacent display panels 10 are substantially the same. This suppresses generation of the visual border between the adjacent display panels 10. Hereinafter, this is described in detail.

Figure 8:
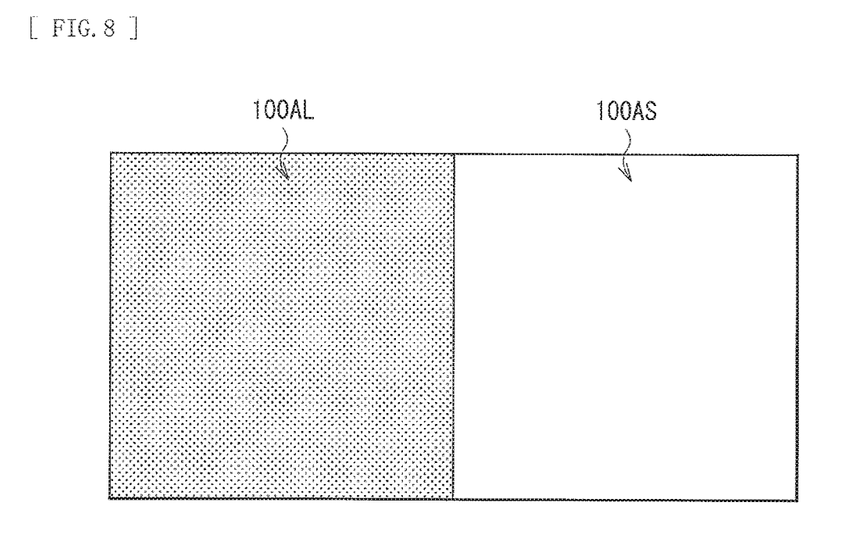
FIG. 8 is a schematic plan view of a configuration of a main portion of a display device according to a comparative example.

FIG. 8 illustrates a planar configuration in which two display panels (display panels 100AS and 100AL) according to a comparative example are disposed side by side. None of the display panels 100AS and 100AL has the first region and the second region (the first region 10A and the second region 10B in FIG. 5 or the like), and light to be emitted from any region in the display panels 100AS and 100AL has the substantially same wavelength. For example, the average wavelength of light to be emitted from the display panel 100AS is 462 nm, and the average wavelength of light to be emitted from the display panel 100AL is 466 nm. A wavelength of light to be emitted from light-emitting elements varies for each of manufacturing lots; therefore, light-emitting elements are combined in manufacturing order, resulting in formation of the display panels 100AS and 100AL in which such average wavelengths of output light are different from each other.

In such a display panel 100AS and such a display panel 100AL, it is possible to match chromaticity of the display panel 100AS and chromaticity of the display panel 100AL with each other by performing chromaticity correction of red (R), green (G), and blue (B). However, there is a possibility that a visual border between the display panel 100AS and the display panel 100AL caused due to a difference in the average wavelength of the output light is generated. Such a visual border is a border caused by a retinal phenomenon, a border caused by chromatic aberration, or the like. Generation of such a visual border degrades image quality significantly.

A method of sorting light-emitting elements for use depending on an emission wavelength is also considered. Examples of the sorting method include bin sorting. However, using sorted light-emitting elements involves disposal of unusable light-emitting elements, resulting in increased costs.

In contrast, in the display device 1, each of the display panels 10 is provided with the second region 10B, and the second regions 10B are disposed between the adjacent first regions 10AS and 10AL. Specifically, here, the display panels 10 come in contact with each other with the second regions 10B interposed therebetween. Consequently, in the vicinity of a portion where the display panels 10 are in contact with each other, the second light LB having the substantially same average wavelength is emitted from the respective second regions 10B, which suppresses generation of the visual border between the adjacent display panels 10. This allows for enhancement of image quality.

Further, in each of the display panels 10, the first region 10A is provided inside the second region 10B, which makes it possible to use the first light-emitting element 12A that emits light (the first light LA) of a wavelength shifted from a wavelength of the second light LB without discarding such a first light-emitting element 12A. This allows for cost reduction.

Figure 9:
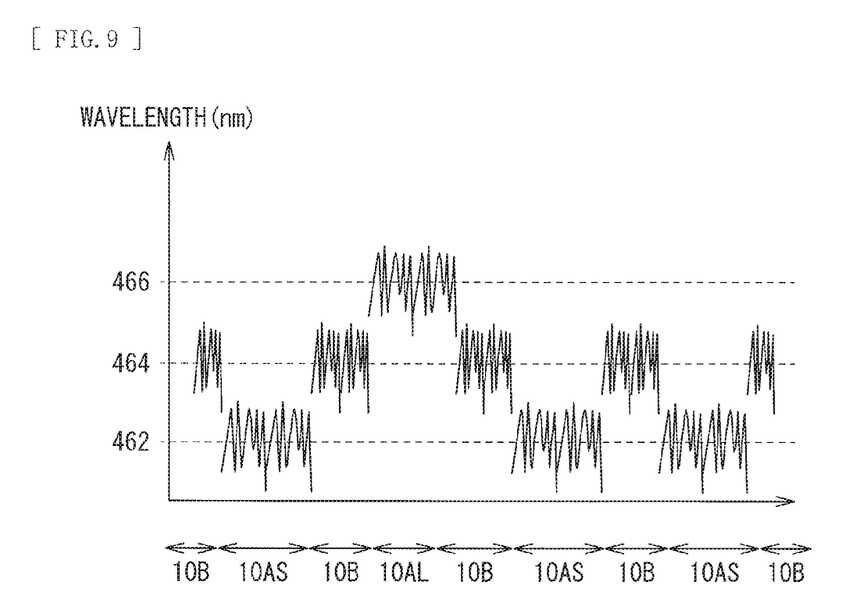
FIG. 9 is a diagram illustrating wavelengths of first light and second light to be emitted from a first region and a second region illustrated in FIG. 6A.

FIG. 9 illustrates an example of a wavelength distribution in a case where the plurality of display panels 10 are disposed adjacently. As seen from the figure, wavelengths vary in a stepwise manner between the first region 10A (the first regions 10AS and 10AL) and the second region 10B. A difference between the average wavelength of the first light LA to be emitted from the first region 10A and the average wavelength of the second light LB to be emitted from the second region 10B is, for example, within 2 nm, and the visual border is not generated between such display panels 10.

As described above, in the present embodiment, the second regions 10B are provided between the adjacent first regions 10AS and 10AL, and the average wavelengths of the second light LB to be emitted from the respective second regions 10B are substantially the same, which makes it possible to suppress generation of the visual border between the adjacent display panels 10. This allows for enhancement of image quality.

Further, the first region 10A is provided inside the second region 10B of each of the display panels 10, which makes it possible to effectively use also the first light-emitting element 12A that emits the first light LA of a wavelength different from a wavelength of the second light LB. This allows for cost reduction.

In addition, even if a detect takes place in one of the display panels 10, and replacement of such a display panel 10 is performed, the necessity for use of the selected display panel 10 is eliminated. In other words, it is possible to easily carry out repairs. The same is true for a case where replacement of the single unit U is performed.

Hereinafter, description is given of modification examples of the foregoing first embodiment and another embodiment; however, in the following descriptions, same components as those in the foregoing first embodiment are denoted by same reference numerals, and the related descriptions are omitted as appropriate.

Modification Example 1

Luminance of first light L1 to be emitted from the first light-emitting element 12A and luminance of second light L2 to be emitted from the second light-emitting element 12B may be different from each other. In other words, the average luminance of the first light L1 to be emitted from the first region 10A and the average luminance of the second light L2 to be emitted from the second region 10B may be different from each other. At this time, a difference in the average luminance between the second light LB to be emitted from the second regions 10B in the adjacent display panels 10 is smaller than a difference between the average luminance of the first light LA and the average luminance of the second light LB in each of the display panels 10. Even in such a case, it is possible to obtain effects similar to those of the foregoing first embodiment.

Modification Example 2

A surface-reflection component of the first light L1 to be emitted from the first light-emitting element 12A and a surface-reflection component of the second light L2 to be emitted from the second light-emitting element 12B may be different from each other. In other words, the average surface-reflection component of the first light L1 to be emitted from the first region 10A and the average surface-reflection component of the second light L2 to be emitted from the second region 10B may be different from each other. At this time, a difference in the average surface-reflection component between the second light LB to be emitted from the second regions 10B in the adjacent display panels 10 is smaller than a difference between the average surface-reflection component of the first light LA and the average surface-reflection component of the second light LB in each of the display panels 10. It is sufficient if the first light L1 to be emitted from the first region 10A and the second light L2 to be emitted from the second region 10B are different in at least one of the average luminance, the average wavelength, or the average surface-reflection component. Even in such a case, it is possible to obtain effects similar to those of the foregoing first embodiment.

Second Embodiment

Figure 10:
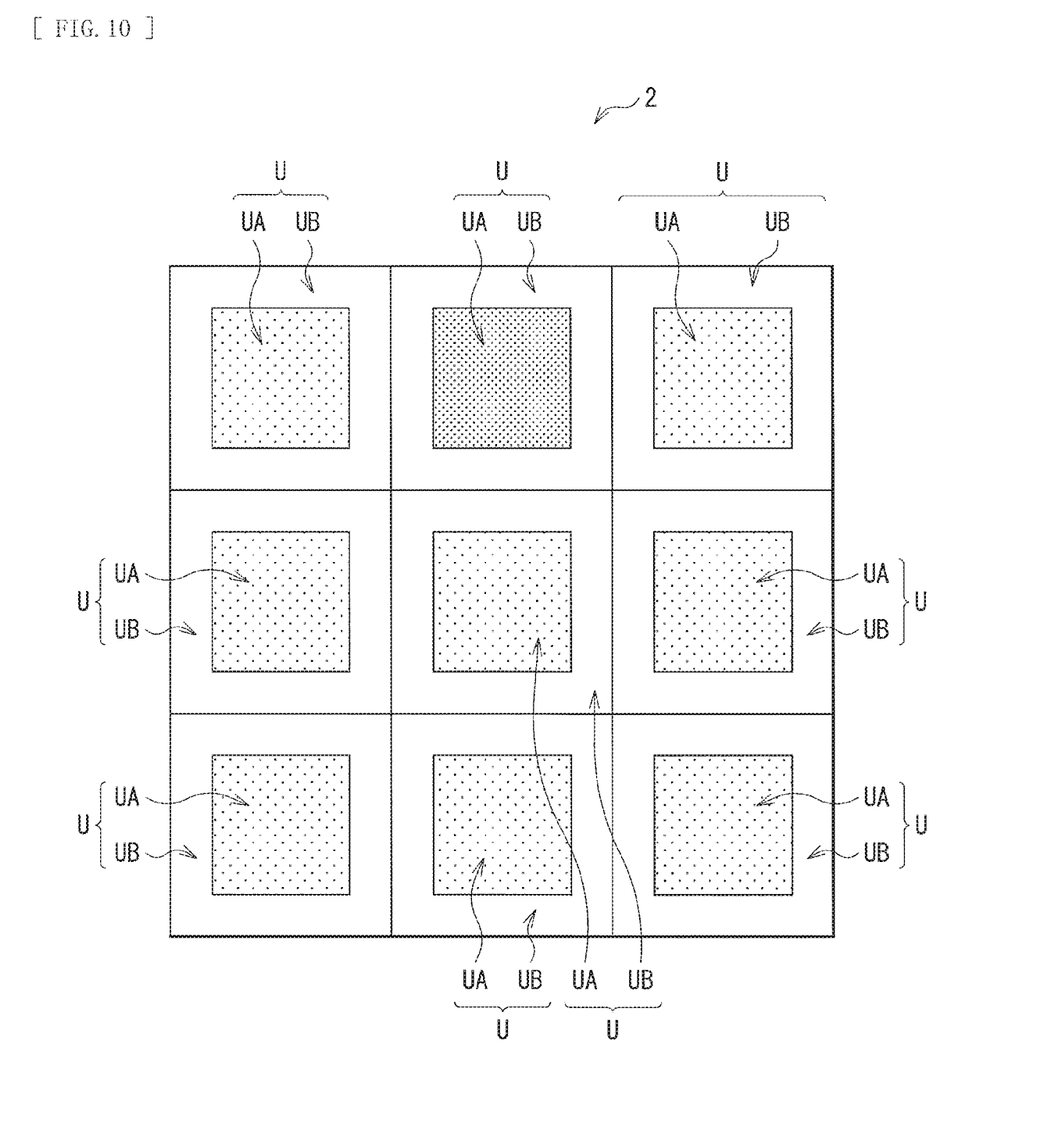
FIG. 10 is a schematic plan view of a configuration of a main portion of a display device according to a second embodiment of the present technology.

FIG. 10 illustrates a schematic planar configuration of a display device (a display device 2) according to a second embodiment of the present disclosure. As seen from the figure, a single unit U may be provided with a first region (a first region UA) and a second region (a second region UB). Except for this point, the display device 2 has configurations and effects similar to those of the display device 1 according to the foregoing first embodiment.

Each of the units U is provided with the first region UA in a middle portion, and the second region 10B outside the first region UA. A planar shape of the first region UA is, for example, a square, and a planar shape of the second region UB is a frame-like square surrounding the first region UA. The planar shapes of the first region UA and the second region UB may be any shapes other than the square. The second regions UB are provided between the adjacent first regions UA. Here, the second regions UB have contact with each other between adjacent ones of the units U. Here, the unit U corresponds to a specific example of a "unit region" in the present technology.

Figure 11:
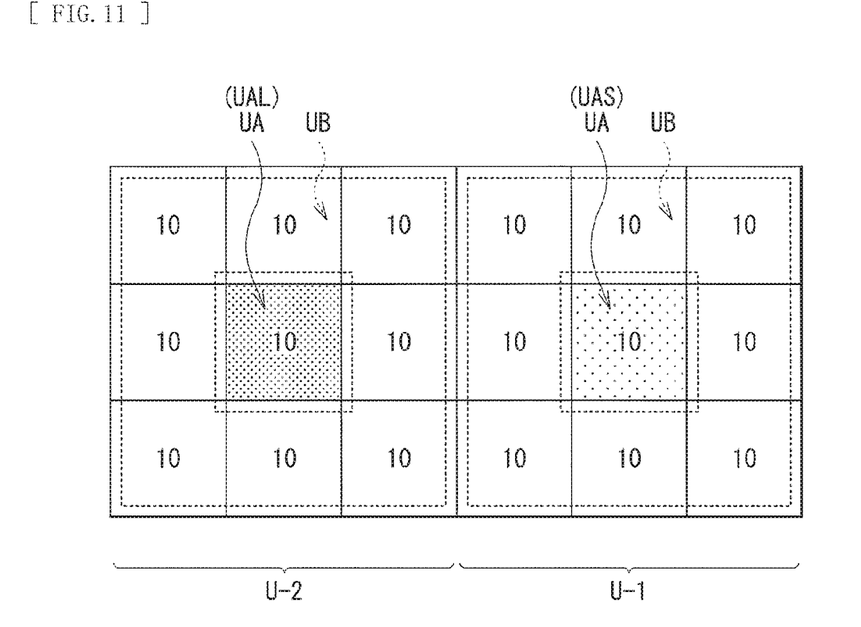
FIG. 11 is an enlarged schematic plan view of two adjacent units of a plurality of units illustrated in FIG. 10.

FIG. 11 illustrates, in an enlarged manner, two adjacent units U (a unit U-1 and a unit U-2) of the plurality of units U illustrated in FIG. 10. In the units U-1 (a first unit region) and U-2 (a second unit region), the first region UA includes, for example, the single display panel 10. The first region UA may include a plurality of display panels 10. The second region UB in each of the units U-1 and U-2 includes a plurality of display panels 10. In the unit U-1, for example, an average wavelength of the first light LA (see FIG. 6B) to be emitted from the first region UA (a first region UAS) is shorter than an average wavelength of the second light LB (see FIG. 6B) to be emitted from the second region UB, and a difference between the average wavelength of the first light LA and the average wavelength of the second light LB is within 2 nm. In the unit U-2, for example, the average wavelength of the first light LA to be emitted from the first region UA (a first region UAL) is longer than the average wavelength of the second light LB to be emitted from the second region UB, and a difference between the average wavelength of the first light LA and the average wavelength of the second light LB is within 2 nm.

In the present embodiment, a difference between the average wavelengths of the second light LB to be emitted from the respective second regions UB in the adjacent units U-1 and U-2 is smaller than a difference between the average wavelength of the first light LA and the average wavelength of the second light LB in each of the units U-1 and U-2. The average wavelengths of the second light LB to be emitted from the respective second regions 10B in the adjacent units U-1 and U-2 are, for example, substantially the same. As described in the foregoing first embodiment, this suppresses generation of a visual border between the unit U-1 and the unit U-2. Further, the expression (1) given in the foregoing first embodiment is also applicable to a relationship between the viewing distance VD and a width of the second region UB.

Figure 12:
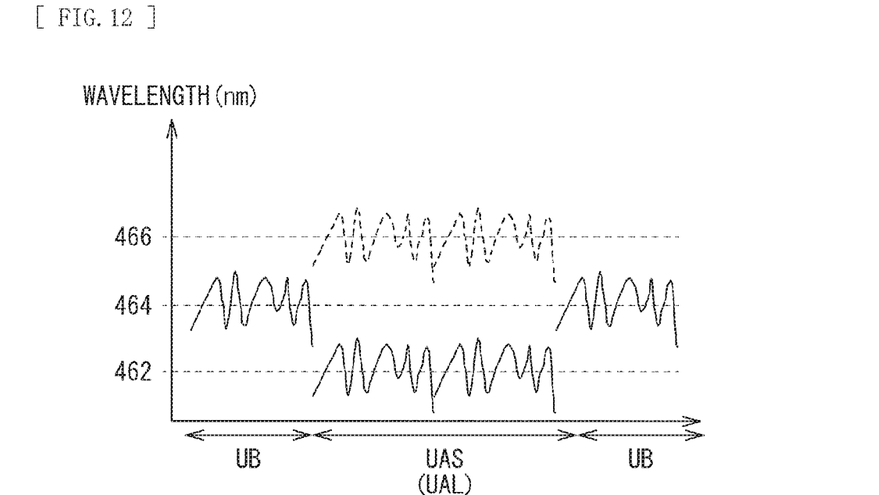
FIG. 12 is a diagram illustrating wavelengths of first light and second light to be emitted from a first region and a second region illustrated in FIG. 11.

FIG. 12 illustrates an example of a wavelength distribution in a case where the plurality of units U are disposed adjacently. As seen from the figure, wavelengths vary in a stepwise manner between the first region UA (the first regions UAS and UAL) and the second region UB. A difference between the average wavelength of the first light LA to be emitted from the first region UA and the average wavelength of the second light LB to be emitted from the second region UB is, for example, within 2 nm, and the visual border is not generated between such units U.

As in the display device 2, the first region UA and the second region UB may be provided for each of the units U. Even in such a case, it is possible to obtain effects similar to those of the foregoing first embodiment. Further, even if a detect takes place in one of the units U, and replacement of such a unit U is performed, the necessity for use of the selected unit U is eliminated. In other words, it is possible to easily carry out repairs. If a detect takes place in one of the display panels 10, and replacement of such a display panel 10 is performed, it is necessary to sort the display panels 10 depending on which one of the first region UA and the second region UB such a display panel 10 includes.

As described in the foregoing modification examples 1 and 2, the average luminance or the surface-reflection component of the first light LA to be emitted from the first region UA and the average luminance or the surface-reflection component of the second light LB to be emitted from the second region UB may be different from each other.

Application Example

Any of the display devices 1 and 2 described in the foregoing first and second embodiments, etc. is applicable to electronic apparatuses in every field that display image signals to be inputted externally or internally generated image signals as images or pictures. Examples of the electronic apparatuses include a television apparatus, a digital camera, a notebook personal computer, a mobile terminal such as a mobile phone, and a video camera. One of the examples is described below.

Figure 13:
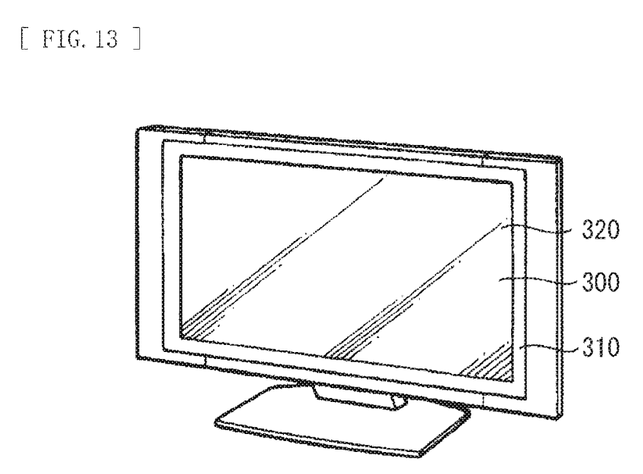
FIG. 13 is a perspective view of an appearance of an electronic apparatus (a television apparatus) according to an application example.

FIG. 13 illustrates an appearance of a television apparatus to which any of the display devices 1 and 2 according to the foregoing first and second embodiments is applied. This television apparatus has, for example, an image display screen section 300 including a front panel 310 and a filter glass 320, and any of the above-described display devices 1 and 2 is used in the image display screen section 300.

Although the present technology has been described above referring to the embodiments and the modification examples, the present technology is not limited to these embodiment, etc., and may be modified in a variety of ways. For example, a material, a thickness and the like of each of components described in the foregoing embodiments, etc. are not limitative, and any other materials and thicknesses may be used.

Further, each of the first light-emitting elements 12A and the second light-emitting elements 12B may include an organic light-emitting diode (OLED: Organic Light-Emitting Diode). Alternatively, the display devices 1 and 2 may be liquid crystal display devices.

Moreover, the display devices 1 and 2 may be provided with a QD (Quantum Dot) filter.

Further, each of the first regions 10A and UA may be divided into two or more regions in accordance with the wavelength, the luminance, or the surface-reflection component of the first light LA.

Figure 14:
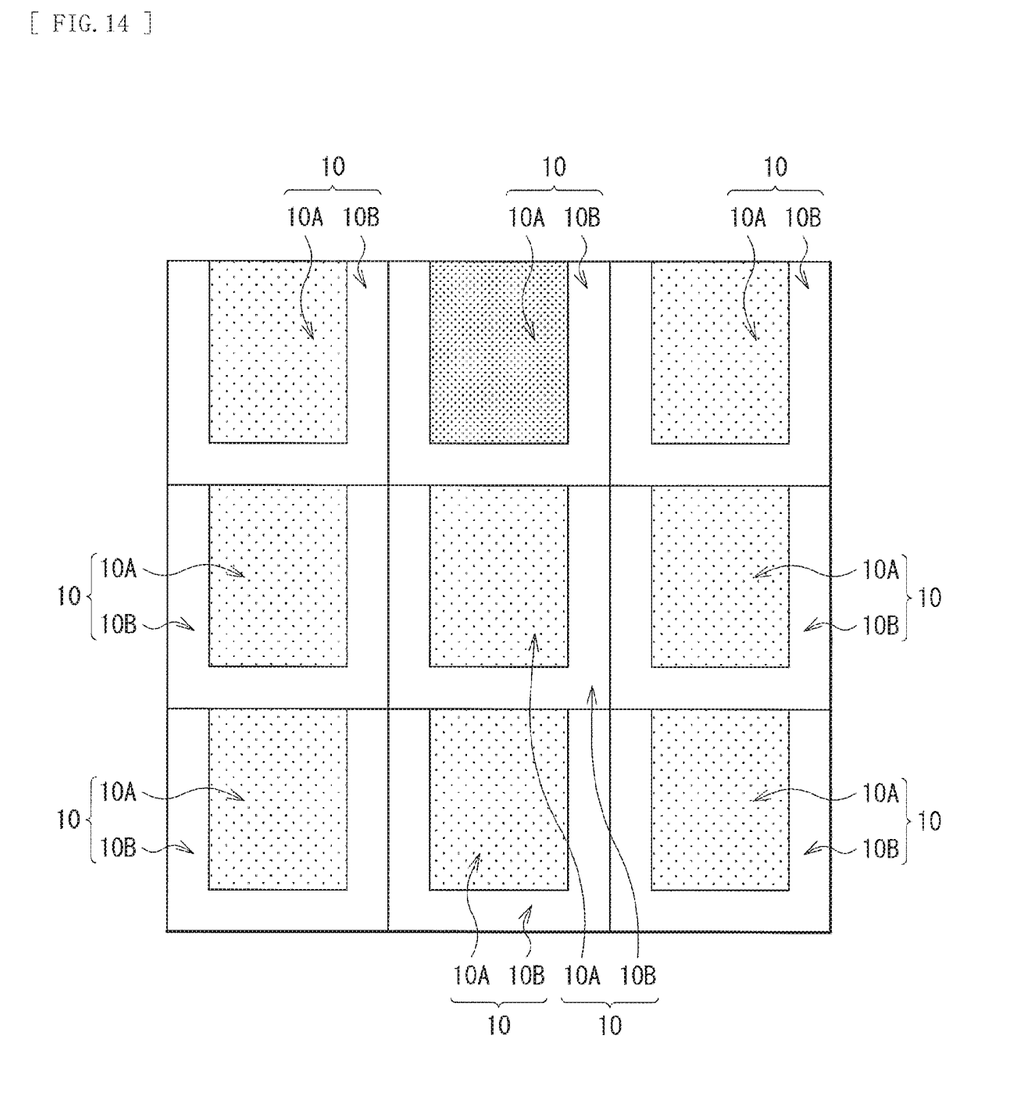
FIG. 14 is a schematic plan view of another example (1) of disposition of a second region illustrated in FIG. 5.
Figure 15:
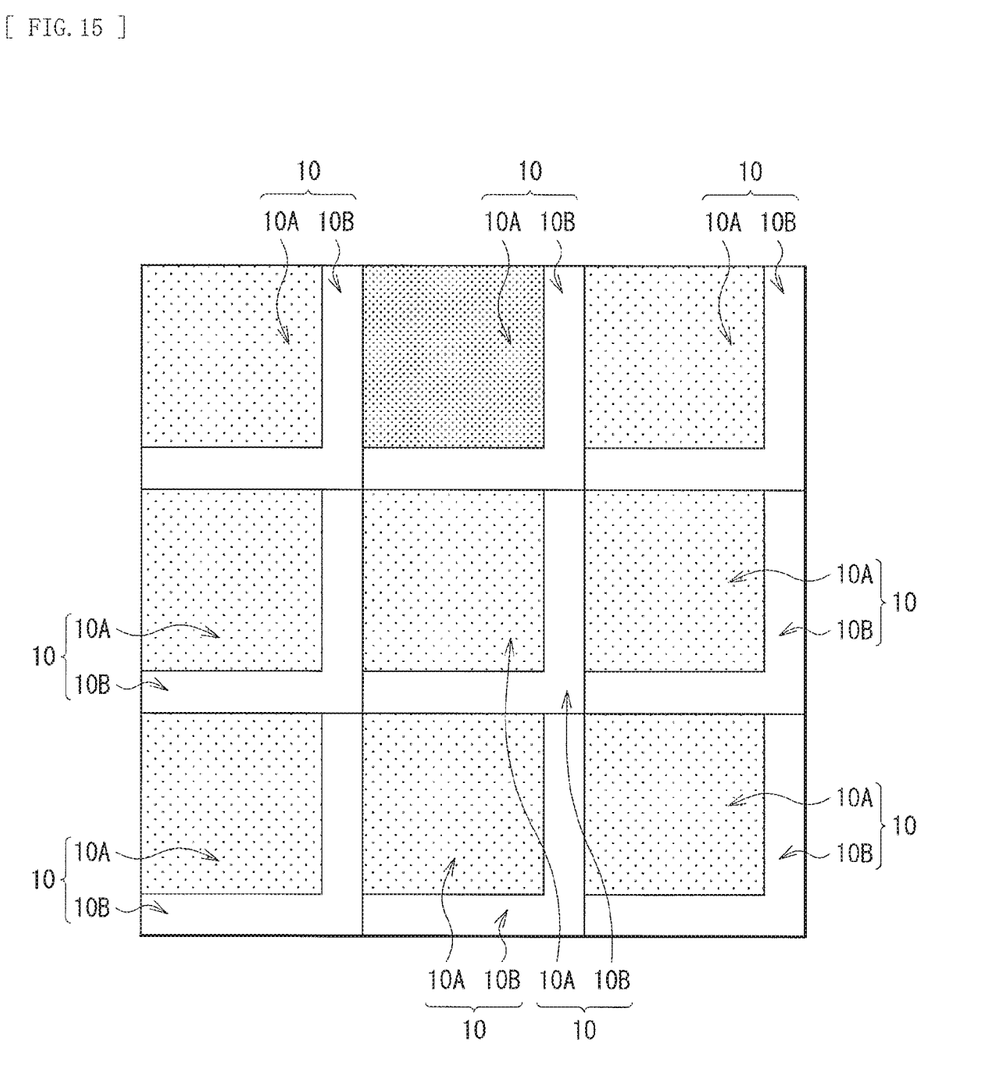
FIG. 15 is a schematic plan view of another example (2) of disposition of the second region illustrated in FIG. 5.

In addition, as illustrated in FIGS. 14 and 15, the second region 10B (or the second region UB) may not surround an entire circumference of the first region 10A (or the first region UA). For example, the second region 10B may be disposed in a U-shape on three outer sides of the first region 10A (FIG. 14), or the second region 10B may be disposed in a L-shape on two outer sides of the first region 10A (FIG. 15).

It is to be noted that the effects described herein are merely illustrative and limitative, and the effects of the present disclosure may be other effects, or there may be achieved other effects.

It is to be noted that the present technology may have the following configurations.

(1)

A display device including:

a plurality of unit regions disposed adjacent to each other;

a first region that is provided in each of the unit regions, and emits first light; and a second region that is provided outside the first region in each of the unit regions, and emits second light, the second light being different from the first light in at least one of luminance, wavelength, or surface-reflection component, the second regions being provided between adjacent ones of the first regions, and a difference in luminance, wavelength, or surface-reflection component between the second light to be emitted from adjacent ones of the unit regions being smaller than a difference in luminance, wavelength, or surface-reflection component between the first light and the second light in a same one of the unit regions.

(2)

The display device according to (1), in which a wavelength of the second light is different from a wavelength of the first light.

(3)

The display device according to (2), in which wavelengths of the second light to be emitted from the respective unit regions are substantially same.

(4)

The display device according to (2) or (3), in which a difference between the wavelength of the second light and the wavelength of the first light in a same one of the unit regions is 2 nm or less.

(5)

The display device according to any one of (2) to (4), in which the plurality of unit regions includes a first unit region and a second unit region, in the first unit region, the wavelength of the first light is shorter than the wavelength of the second light, and in the second unit region, the wavelength of the first light is longer than the wavelength of the second light.

(6)

The display device according to any one of (1) to (5), in which the second region in each of the unit regions is provided to surround the first region.

(7)

The display device according to any one of (1) to (6), in which a plurality of display panels laid in a tiled pattern is included, and each of the display panels is provided with the first region and the second region.

(8)

The display device according to (7), further including a light-shielding layer provided in each of the display panels, in which the first light and the second light are extracted through an opening of the light-shielding layer.

(9)

The display device according to (7) or (8), further including:

a plurality of first light-emitting elements provided in the first region of each of the unit regions; and a plurality of second light-emitting elements provided in the second region of each of the unit regions.

(10)

The display device according to (9), in which the first light-emitting elements and the second light-emitting elements each include a micro LED (Light-Emitting Diode).

(11)

The display device according to (9) or (10), in which the first light-emitting element and the second light-emitting element are disposed for each of pixels provided in the first region and the second region, and an area occupied by the first light-emitting element or the second light-emitting element relative to an area of each of the pixels is 10% or less.

(12)

The display device according to any one of (1) to (6), in which a plurality of units laid in a tiled pattern is included, each of the plurality of units including a plurality of display panels, and each of the units is provided with the first region and the second region.

(13)

The display device according to any one of (1) to (12), in which the first light and the second light include light of a blue wavelength band.

(14)

The display device according to any one of (1) to (13), in which the second regions are in contact with each other in adjacent ones of the unit regions.

(15)

An electronic apparatus provided with a display device, the display device including:

a plurality of unit regions disposed adjacent to each other;

a first region that is provided in each of the unit regions, and emits first light; and a second region that is provided outside the first region in each of the unit regions, and emits second light, the second light being different from the first light in at least one of luminance, wavelength, or surface-reflection component, the second regions being provided between adjacent ones of the first regions, and a difference in luminance, wavelength, or surface-reflection component between the second light to be emitted from adjacent ones of the unit regions being smaller than a difference in luminance, wavelength, or surface-reflection component between the first light and the second light in a same one of the unit regions.

This application claims the priority on the basis of Japanese Patent Application No. 2017-110597 filed on Jun. 5, 2017 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display device, comprising:

a plurality of unit regions, wherein the plurality of unit regions comprises a first unit region and a second unit region adjacent to the first unit region, each of the first unit region and the second unit region comprises a first region and a second region, the first region is configured to emit a first light, the second region is outside the first region in each of the first unit region and the second unit region, the second region is configured to emit a second light, the second region of the first unit region is in contact with the second region of the second unit region, the second light is different from the first light in at least one of luminance, wavelength, or surface-reflection component, the second region of the first unit region and the second region of the second unit region are between adjacent first regions of the plurality of unit regions, and a first difference in one of luminance, wavelength, or surface-reflection component between the second light to be emitted from adjacent unit regions of the plurality of unit regions is smaller than a second difference in a respective one of luminance, wavelength, or surface-reflection component between the first light and the second light in a same unit region of the plurality of unit regions.

2. The display device according to claim 1, wherein a wavelength of the second light is different from a wavelength of the first light.

3. The display device according to claim 2, wherein the wavelength of the second light emitted from the second region of each of the first unit region and the second unit region is substantially same.

4. The display device according to claim 2, wherein a difference between the wavelength of the second light and the wavelength of the first light emitted from one of the first unit region or the second unit region is 2 nm or less.

5. The display device according to claim 2, wherein in the first unit region, the wavelength of the first light is shorter than the wavelength of the second light, and in the second unit region, the wavelength of the first light is longer than the wavelength of the second light.

6. The display device according to claim 1, wherein the second region surrounds the first region in each of the first unit region and the second unit region.

7. The display device according to claim 1, wherein the plurality of unit regions are display panels laid in a tiled pattern.

8. The display device according to claim 7, further comprising a light-shielding layer in each of the plurality of unit regions, wherein the first light and the second light are extracted through an opening of the light-shielding layer.

9. The display device according to claim 7, further comprising:

a first light-emitting element in the first region of each of the first unit region and the second unit region; and a second light-emitting element in the second region of each of the first unit region and the second unit region.

10. The display device according to claim 9, wherein each of the first light-emitting element and the second light-emitting element comprise a micro light-emitting diode (LED).

11. The display device according to claim 9, further comprising a plurality of pixels in each of the first region and the second region, wherein the first light-emitting element corresponds to each of the plurality of pixels of the first region, the second light-emitting element corresponds to each of the plurality of pixels of the second region, and an area occupied by one of the first light-emitting element or the second light-emitting element relative to an area of each of the plurality of pixels is 10% or less.

12. The display device according to claim 1, wherein each of the first light and the second light comprises light of a blue wavelength band.

13. The display device according to claim 1, wherein the second region surrounds an entire circumference of the first region.

14. The display device according to claim 1, wherein the first region includes four outer sides, and the second region covers two of the four outer sides of the first region.

15. The display device according to claim 1, wherein the first region includes four outer sides, and the second region covers three of the four outer sides of the first region.

16. An electronic apparatus, comprising:

a display device, wherein the display device includes:

a plurality of unit regions, wherein the plurality of unit regions comprises a first unit region and a second unit region adjacent to the first unit region, each of the first unit region and the second unit region comprises a first region and a second region, the first region is configured to emit a first light, the second region is outside the first region in each of the first unit region and the second unit region, the second region is configured to emit a second light, the second region of the first unit region is in contact with the second region of the second unit region, the second light is different from the first light in at least one of luminance, wavelength, or surface-reflection component, the second region of the first unit region and the second region of the second unit region are between adjacent first regions of the plurality of unit regions, and a first difference in one of luminance, wavelength, or surface-reflection component between the second light to be emitted from adjacent unit regions of the plurality of unit regions is smaller than a second difference in a respective one of luminance, wavelength, or surface-reflection component between the first light and the second light in a same unit region of the plurality of unit regions.

* * * * *